(12) United States Patent
Li

(10) Patent No.: US 8,014,431 B2
(45) Date of Patent: Sep. 6, 2011

(54) VERTICAL SURFACE LIGHT EMITTING DEVICE WITH MULTIPLE ACTIVE LAYERS

(76) Inventor: Yiquan Li, Hong Kong (CN)

(*) Notice: Subject to any disclaimer, the term of this patent is extended or adjusted under 35 U.S.C. 154(b) by 200 days.

(21) Appl. No.: 12/514,065

(22) PCT Filed: Oct. 29, 2007

(86) PCT No.: PCT/CN2007/003062
§ 371 (c)(1),
(2), (4) Date: May 7, 2009

(87) PCT Pub. No.: WO2008/055409
PCT Pub. Date: May 15, 2008

(65) Prior Publication Data
US 2010/0002741 A1 Jan. 7, 2010

(30) Foreign Application Priority Data

Nov. 9, 2006 (CN) .......................... 2006 1 0148447

(51) Int. Cl.
*H01S 5/00* (2006.01)
(52) U.S. Cl. ............. 372/50.124; 372/45.01; 372/46.01; 372/50.12; 257/14; 257/39
(58) Field of Classification Search ............... 372/44.01, 372/45.01, 45.012, 50.12, 50.124, 46.01; 257/14, 39
See application file for complete search history.

(56) References Cited

U.S. PATENT DOCUMENTS

| 7,099,364 | B2* | 8/2006 | Watanabe et al. ........ 372/46.013 |
| 2003/0160254 | A1* | 8/2003 | Henrichs .......................... 257/88 |
| 2006/0291516 | A1* | 12/2006 | Aoki ........................... 372/50.11 |
| 2008/0107373 | A1* | 5/2008 | Lee ................................. 385/14 |

FOREIGN PATENT DOCUMENTS

WO WO 2006097018 A1 * 9/2006

* cited by examiner

*Primary Examiner* — Jessica Stultz
*Assistant Examiner* — Yuanda Zhang
(74) *Attorney, Agent, or Firm* — Kevin J. McNeely; McNeely, Hare & Ware LLP

(57) ABSTRACT

A vertical cavity surface light emitting device (VCSLED) with multiple active layers includes at least one optical resonance unit comprising a highly-doped conduction region (1), an insulating layer (2), a negative electrode (3), confinement layers (4, 6), an active layer (5), and a positive electrode (7). The optical resonance units are stacked repetitively in a vertical thickness of half wavelength to constitute an optical resonant cavity. In the laser produced from the VCSLED with multiple active layers, the VCSLED is sandwiched by reflectors (104, 105) for emitting and receiving laser light. The laser utilizes the ability of photonic crystal to emit coherent light to improve its electro-optical conversion efficiency and eliminate the fabrication of Bragg reflectors.

16 Claims, 8 Drawing Sheets

VERTICAL SURFACE LIGHT EMITTING DEVICE WITH MULTIPLE ACTIVE LAYERS

CROSS REFERENCE TO RELATED APPLICATIONS

This national phase entry application claims priority to Chinese patent application 200610148447.9 filed on Nov. 9, 2006, and international patent application PCT/CN2007/003062 filed on Oct. 29, 2007, which are hereby incorporated by reference.

FIELD OF THE INVENTION

The present invention relates to a laser, more particularly, it relates to a vertical cavity surface laser with multiple active layers.

BACKGROUND OF THE INVENTION

Following edge emitting lasers, vertical cavity surface emitting lasers (VCSELs) have emerged as an important electro-optical converter for producing laser light. VCSELs emit the laser light towards their vertical cavity surfaces at a small angle, providing ease of integration and arrangement, and therefore VCSELs are especially suitable for use as a high density emitting device and as a communication bus between chips. However, conventional VCSELs require multilayer-distributed Bragg reflectors (DBRs) which utilize a material different from the active layers, such that fabrication of the conventional VCSELs is very complicated. In addition, the electro-optical conversion efficiency of the conventional VCSELs is also limited due to high internal resistance induced by the reflectors.

On the other hand, the conventional VCSELs are able to emit laser light of a single wavelength and unable to obtain a plurality of wavelengths in one device. Therefore, in some applications, it is necessary to use a plurality of VCSELs producing various wavelengths in order to obtain a plurality of wavelengths. As a result, not only are the VCSELs fabrication costs increased, but also their integration is not good enough to reduce density.

BRIEF DESCRIPTION OF THE INVENTION

It is an object of the present invention to provide a vertical cavity surface light emitting device (VCSLED) with multiple active layers, which is capable of increasing its electro-optical conversion efficiency. Another object of the present invention is to provide a laser produced from the above VCSLED with multiple active layers.

These objects are achieved by providing a vertical cavity surface light emitting device (VCSLED) with multiple active layers, which comprises at least one optical resonance unit comprising a highly-doped conduction region, an insulating layer, a negative electrode, confinement layers, an active layer, and a positive electrode. The optical resonance units are stacked repetitively in a vertical thickness of a half wavelength to constitute an optical resonant cavity.

The optical resonant cavity has repeated n-p symmetrical structures or asymmetrical structures.

The VCSLED with multiple active layers further comprises an optical path parameter control layer disposed between the active layers for fine tuning a resonance wavelength. Altering a bias voltage between a parameter control electrode and a power supply electrode allows adjustment in an effective optical path distance for light transmission of the control layer, thereby controlling the resonance wavelength accordingly.

One or more parameter measuring electrodes are arranged between the confinement layers for detecting light field parameters inside the optical resonant cavity.

According to another aspect, there is provided a laser produced from the VCSLED with multiple active layers, wherein the VCSLED is sandwiched by reflectors for emitting and receiving laser light.

The laser further includes piezoelectric crystals disposed between a plurality of chips for maintaining the active layers between the chips to be spaced apart at integer multiples of wavelength.

The laser further includes piezoelectric crystals disposed between the reflectors for adjusting the reflectors for their distances and parallel angles.

The laser further includes a parameter feedback calculation module connected to the parameter measuring electrodes and to the piezoelectric crystals which adjust the distances between the chips for real time adjusting distribution state parameters of the light field inside the optical resonant cavity.

According to a further aspect, there is provided a laser produced from the VCSLEDs with multiple active layers, wherein two or more of the VCSLEDs are paralleled to aggregate on a same surface of a chip. The optical resonant cavities have respective partial reflectors at their two ends for controlling the coupling of the optical resonant cavities with a light channel such that the light channel forms at a center of the aggregation of the VCSLEDs.

At two ends of the optical resonant cavities of the aggregated VCSLEDs are respective conical energy collectors for collecting external light emitting from the optical resonant cavities into the light channel located at the center through conical total reflection surfaces of the energy collectors.

A signal bus is produced from the above lasers, wherein the signal bus forms by using a signal line to connect the stacked chips on which the lasers with multiple active layers are arranged with their optical resonant cavities at a same position in alignment with each other, and constitutes a light channel that runs through and connects all the stacked chips.

The invention integrates a VCSEL technique with a photonic crystal technique to produce a VCSEL having an optical resonant cavity with a thickness of multiple wavelengths, which is different from the conventional optical resonant cavity having a thickness of a single wavelength.

In one embodiment, the VCSEL includes a plurality of active layers that are arranged at respective antinodes to constitute a spatially coherent photonic crystal which is able to emit coherent light, such that the electro-optical conversion efficiency can be improved and the fabrication of Bragg reflectors is eliminated.

DETAILED DESCRIPTION OF THE INVENTION

Figure 1:
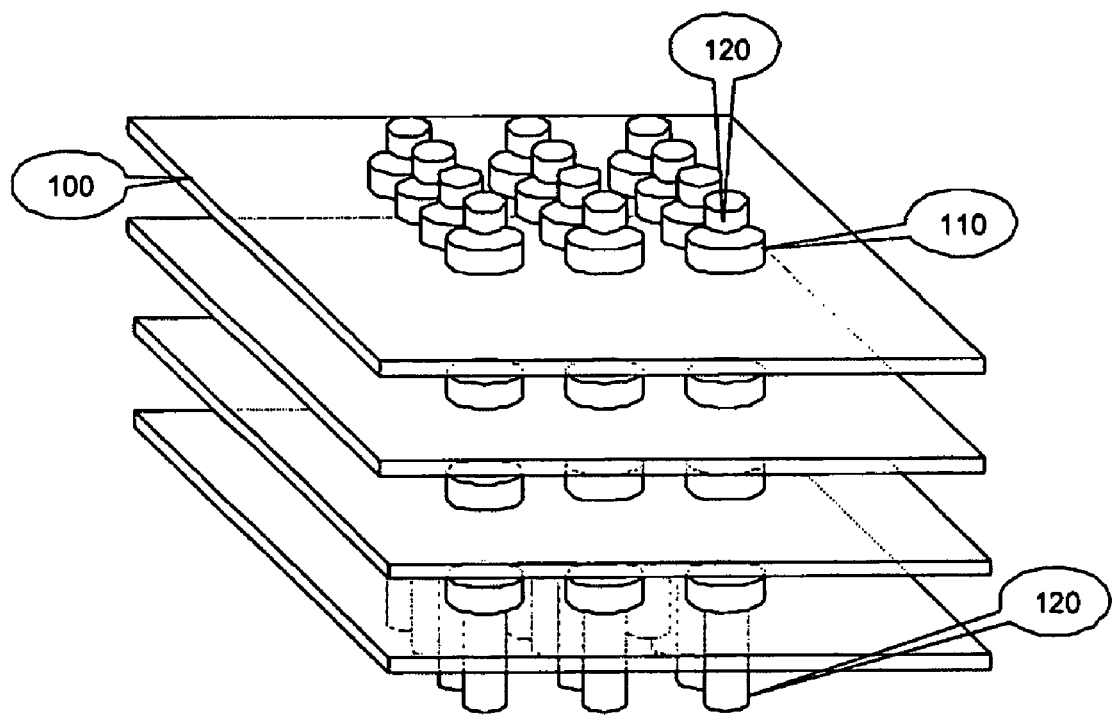
FIG. 1 shows a schematic diagram of a signal bus running through all layers of stacked chips.

FIG. 1 illustrates a schematic diagram of a signal bus running through all layers of stacked chips, showing a plurality of VCSLEDs with multiple active layers, i.e., the VCSLEDs are arranged on a layer of chip 100 for emitting and receiving laser light. The plurality of VCSLEDs have respective optical resonant cavities 110 that are stacked, wherein the optical resonant cavities at a same position on all layers of the chips are connected by a signal line 120 and aligned with each other to form a light channel connecting all of the stacked chips. The light channel is able to transmit various types of information among the chips. The wavelength of the light transmitted by the light channel is selected such that the chip material is transparent with respect to the light channel. It is also possible to perforate the corresponding channel portions of the chips or to establish a waveguide 102 in the chips by using a femtosecond laser.

Figure 2:
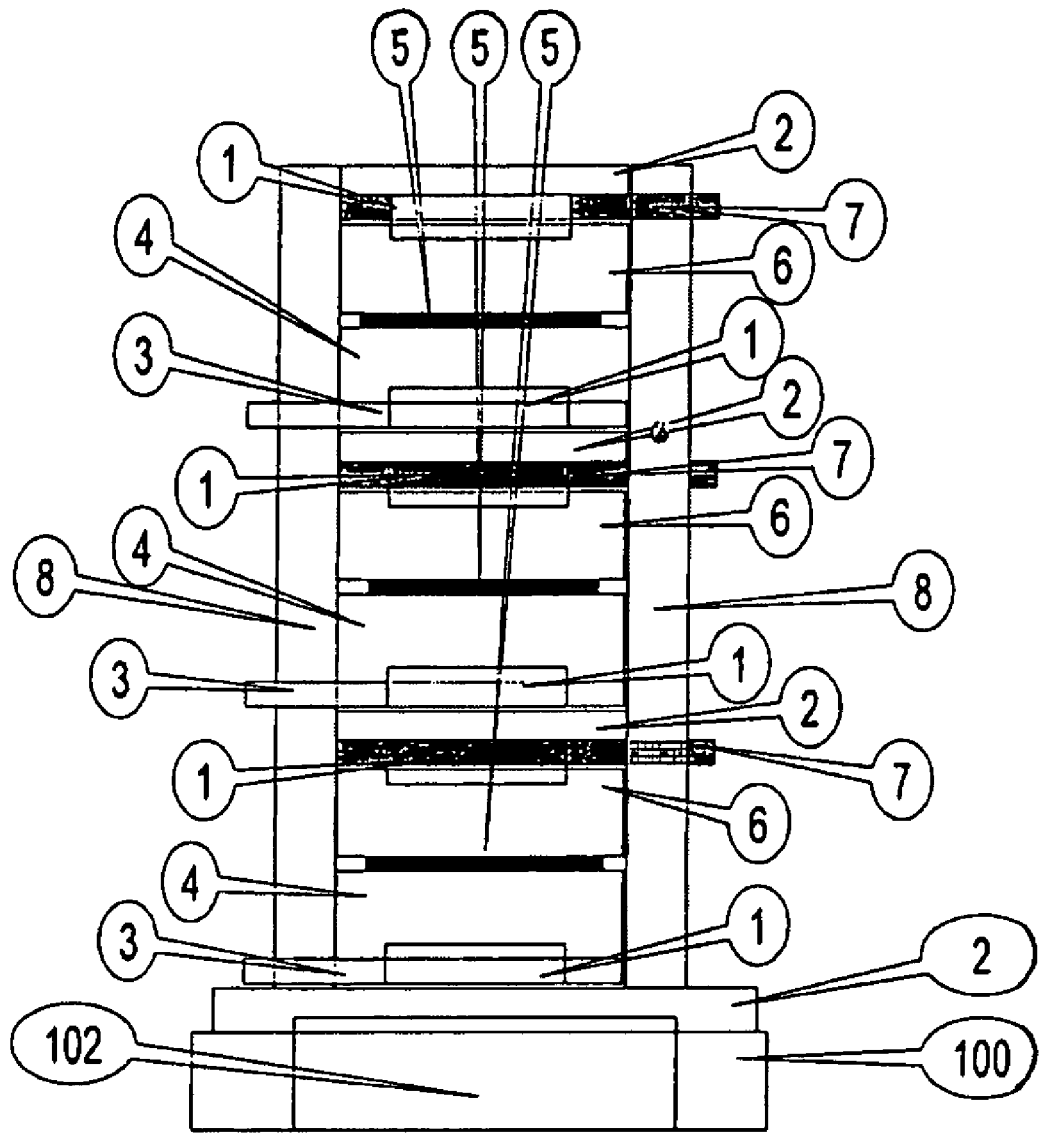
FIG. 2 shows a schematic sectional view of an optical resonant cavity of VCSEL with multiple active layers.

FIG. 2 illustrates a schematic sectional view of the optical resonant cavity with multiple active layers. The optical resonant cavity has a transparent insulating layer 2 disposed on the chip in order for isolating the chip from other parts. A highly-doped conductive layer 1 grows on the transparent insulating layer 2 so as to increase a transverse conductivity and reduce a series resistance. A ring is etched to surround the periphery of the conductive layer 1, and the interior of the ring can be constructed to be araneose and deposited with metal to serve as an interface of negative electrode 3 of the power source. The electrode is positioned in the trough of the light standing wave, and can be formed to be araneose or nearly closed, in such a manner that the electrode does not substantially affect the transmission of resonant light wave. A wide band gap confinement layer 4, such as a n-type AlGaA layer, is implanted on the electrode 3 till a position of about ¼ wavelength. On the confinement layer 4 grows an active layer 5 with a thickness of about 10 nm, and on the active layer 5 are implanted a p-type wide band gap confinement layer 6 of about ¼ wavelength, a highly-doped conductive layer 1 and a positive electrode 7 in sequence.

A typical surface emitting LED structure forms starting from the chip 100 to the metal positive electrode 7, which structure emits light when a forward current is applied thereto. The luminous efficiency would be relatively high because recombination of carriers is restricted to take place within the active layer sandwiched by the upper and lower wide band gap layers.

The structure starting from the insulating layer 2 to the metal positive electrode 7 is repeated and the thickness of the repeated structure is strictly controlled to be exactly a half wavelength of the composite light. FIG. 2 illustrates three structures of this type. In fact, 3-20 structures or even more can be repeated. Thus, a wavelength sensitive optical resonant cavity forms and exhibits an extremely high Q-value for the light resonance wavelength. The composite light emitting from the multiple active layers is coherent in spatial distribution, and has restrained spontaneous radiation, and hence, light lasing generates easily. The multilayered structures are spaced apart at a half-wavelength to form a photonic crystal in which the resonant light can be transmitted with nearly zero attenuation. The light emitting from the active layers 5 is not easy to be absorbed. To further prevent the light and electricity from diffusing outwardly, selective oxidation technique or ion implantation technique can be used to produce an enclosure 8 surrounding the cylindrical multilayered structures.

Figure 3:
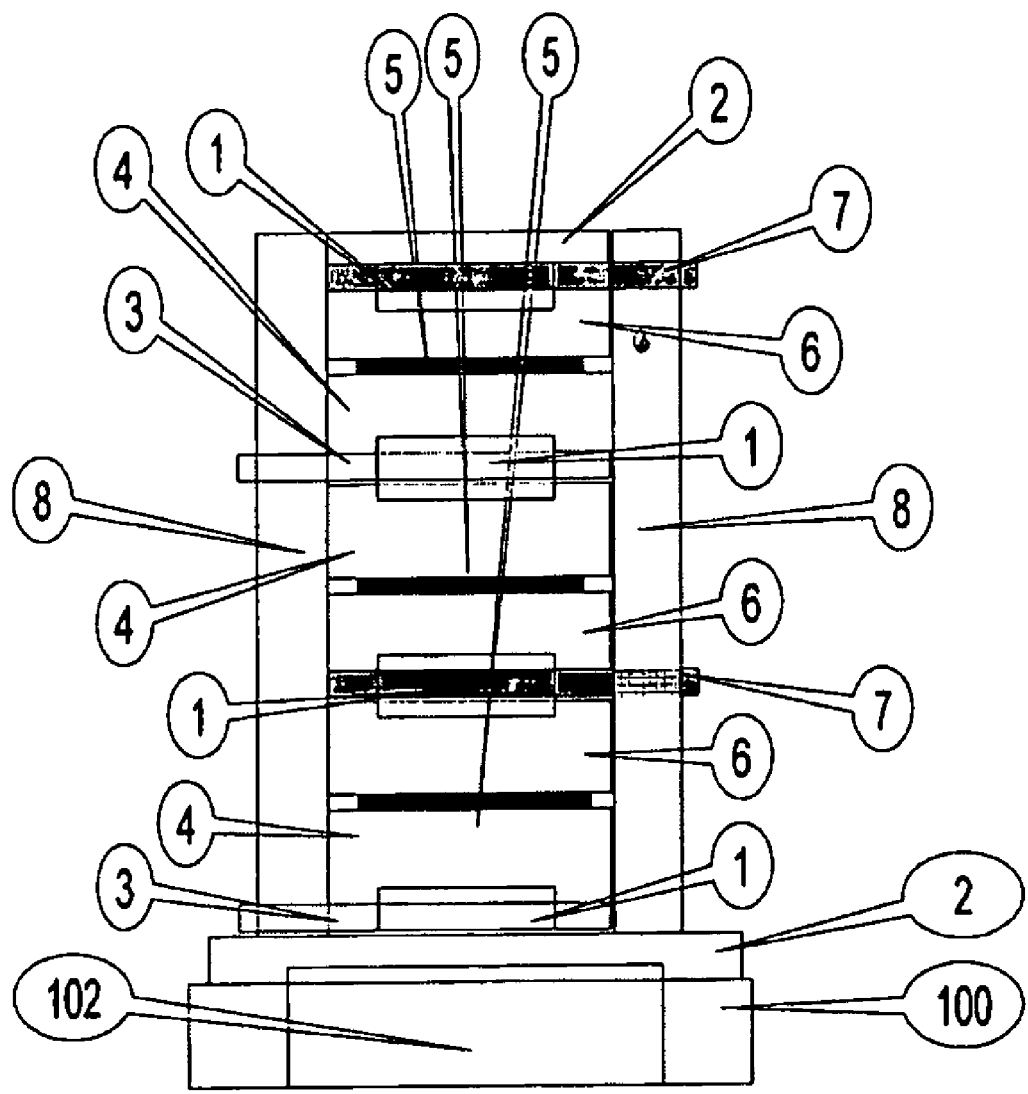
FIG. 3 shows a schematic sectional view of a n-p symmetrical optical resonant cavity.

FIG. 3 illustrates a schematic sectional view of a n-p symmetrical optical resonant cavity. The structure is symmetrical to n-type and p-type semiconductors, and can emit light even if the n-p is interconverted or switched to reverse the power supply. Interconverting the n-p of the middle luminous structure in FIG. 2 results in that the electrode polarity of the adjacent structures becomes the same. Therefore, the middle insulating layer 2 can be removed, and the metal electrode 7 and the highly-doped region 1 can be integrated to simplify the structure of the optical resonant cavity with a reduced number of layers, thus its fabrication is easier.

In addition, the same effect can be produced by removing the positive electrode 7, the negative electrode 3 adjacent to the positive electrode 7 and the insulating layer therebetween in FIG. 2, and then applying a high voltage in series across the top and bottom layers.

Figure 4:
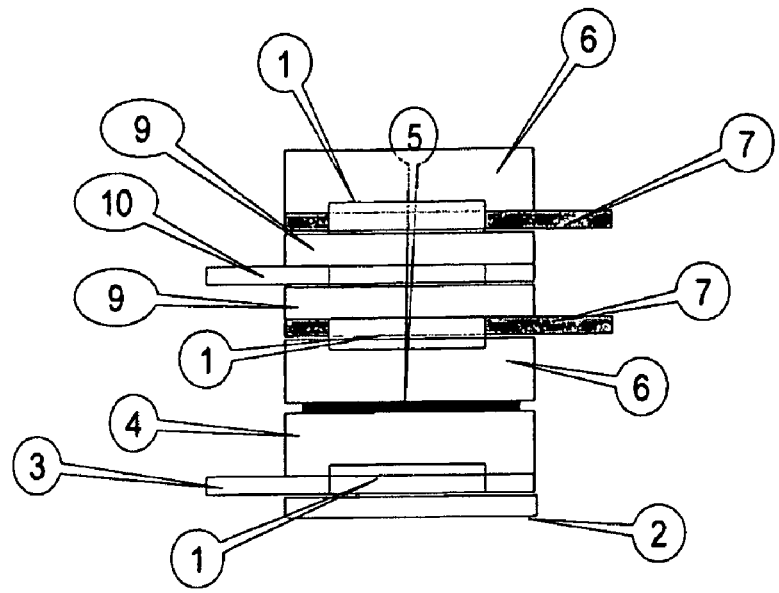
FIG. 4 shows a schematic sectional view of the optical resonant cavity having an optical path parameter control layer.

It is known that an optical path between the active layers is an important parameter for the optical resonant cavity, and determines the resonance wavelength. In order to correct errors during mass production or fine tune the wavelengths, an optical path parameter control layer 9 is arranged in the optical resonant cavity, as shown in FIG. 4. The optical path parameter control layer 9 utilizes the sensitivity of a semiconductor or a crystal to the electromagnetic conductivity to alter the bias voltage across a parameter control electrode 10 and the power supply electrode 7 or 3, so as to adjust the effective optical path distance for light transmission of the control layer 9, and thus adjust the resonance wavelength.

The parameter control layer 9 can be made from any material sensitive to light transmission parameters, or can be constructed as a layer of simple p-n node. The parameter control layer 9 is used to adjust the effective wavelengths of various groups of light emitting elements arranged on the same chip.

Figure 5:
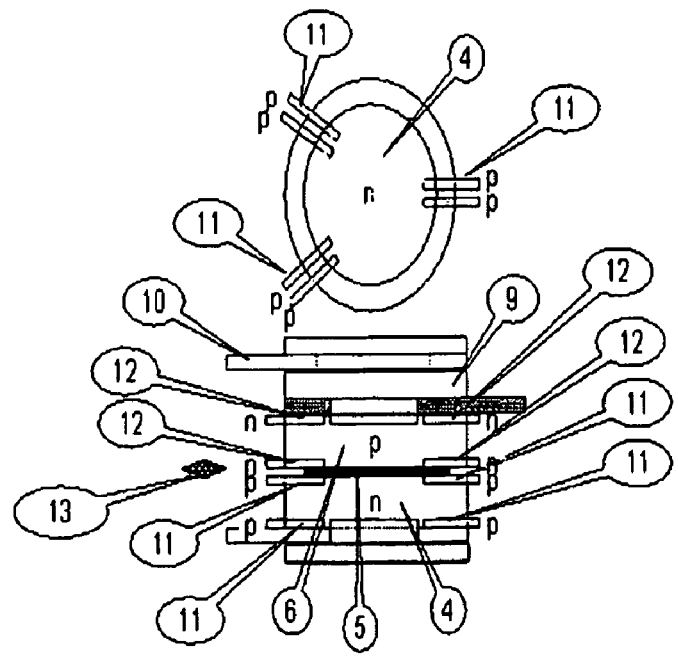
FIG. 5 shows a schematic sectional view of parameter measuring electrodes.

In order to control light oscillation inside the optical resonant cavity and to obtain distribution states of the light field inside the optical resonant cavity, it is optimum to read data in the confinement layers. As shown in FIG. 5, two p-type electrodes 11 are inserted in the n-type confinement layer 4, or n-type electrodes 12 are inserted in the p-type confinement layer 6. The crest of the light standing wave is located at a plane adjacent to the active layer 5 where the carriers are the most active and the impedance between the electrodes is the lowest. On the other hand, the trough of the light standing wave is located at a plane at a distance of ¼ wavelength from the active layer where the number of carriers is the least and the impedance between the electrodes is the highest. The data of the light field can be obtained by reading signals from the probes. An electrode 13, which is a thermally sensitive element, can be arranged on the exterior of the optical resonant cavity, particularly near the active layer 5, for temperature detection.

Figure 6:
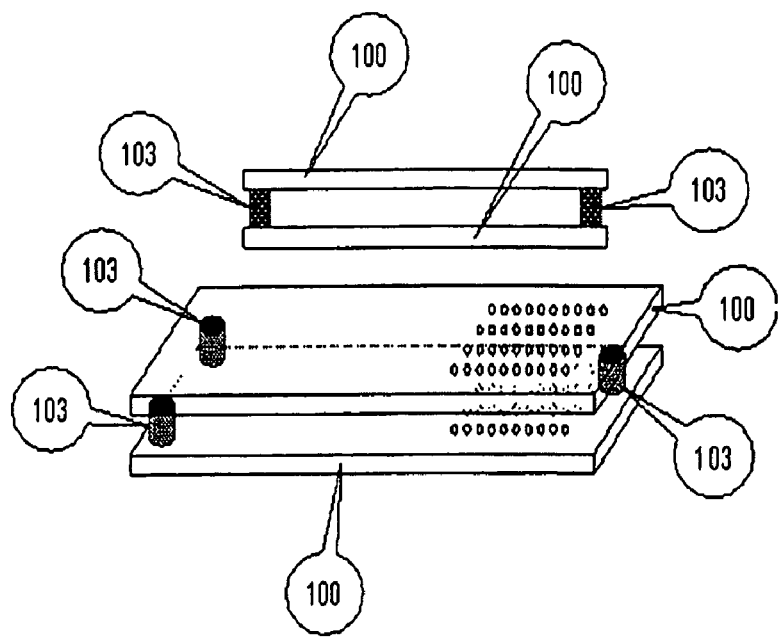
FIG. 6 shows a schematic diagram of embedded piezoelectric crystals.
Figure 7:
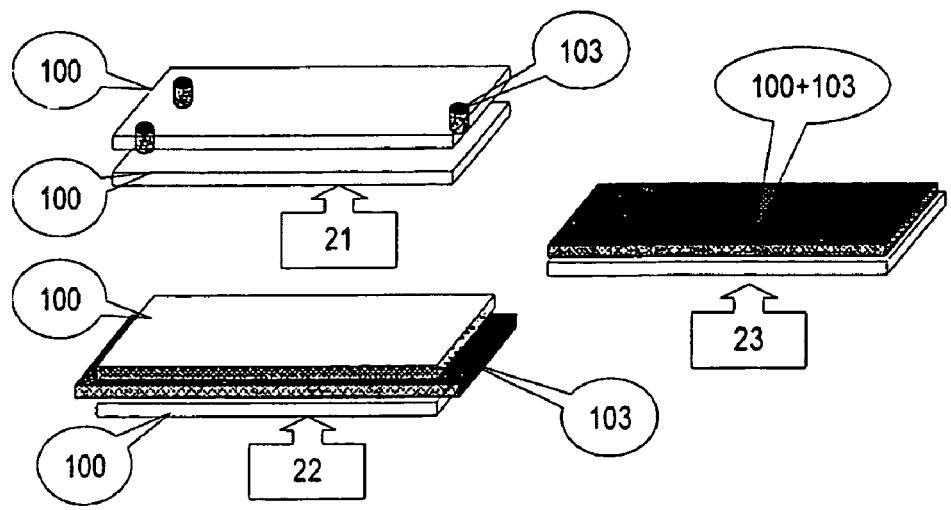
FIG. 7 shows a schematic diagram of controlling a distance between the chips.

Stacking a plurality of chips would lead to the coupling of coherent light between the chips, however, this coupling would be affected by the distance between the two chips. If the respective active layers of the chips are spaced apart from each other at integer multiples of wavelength, the signals received from other chips would be the most sensitive, and the light emitting simultaneously from the plurality of chips would be intensified too. As shown in FIG. 6, three sheets of piezoelectric crystals 103 having separate fulcrums are embedded between the chips 100. Altering the voltages of the piezoelectric crystals would allow for controlling the paralleling and distance between the chips for the best coupling. In the case that the chips are sufficiently parallel, a sheet of separately integrated parallel piezoelectric crystal can be used as a spacer between the chips, as shown in FIG. 7; or the piezoelectric crystals can grow with the chips directly. The use of the piezoelectric crystals 103 to adjust the distance between the chips is not necessary if the chips are manufactured precisely enough, in this case, the parameter control layers 9 are enough to maintain the optical paths between the active layers of the plurality of chips to be spaced apart within a range of integer multiples of wavelength.

Figure 8:
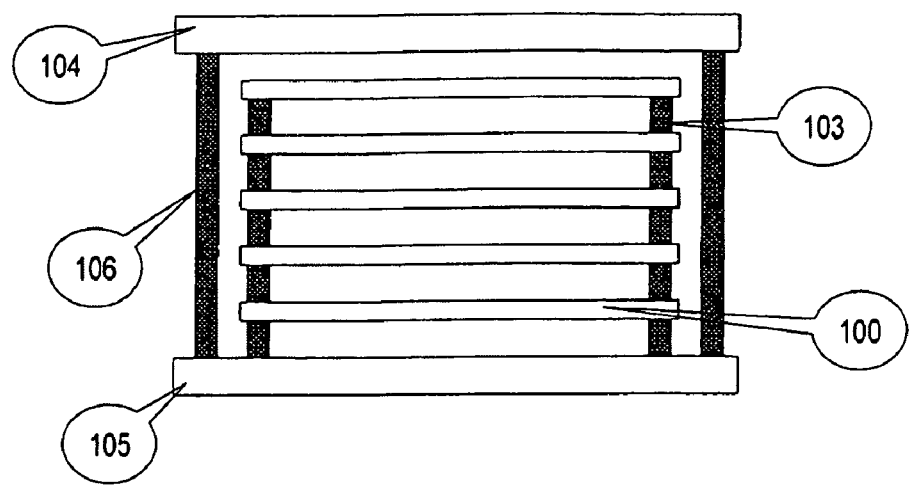
FIGS. 8 and 9 show schematic diagrams of the chips sandwiched by the reflectors.
Figure 9:
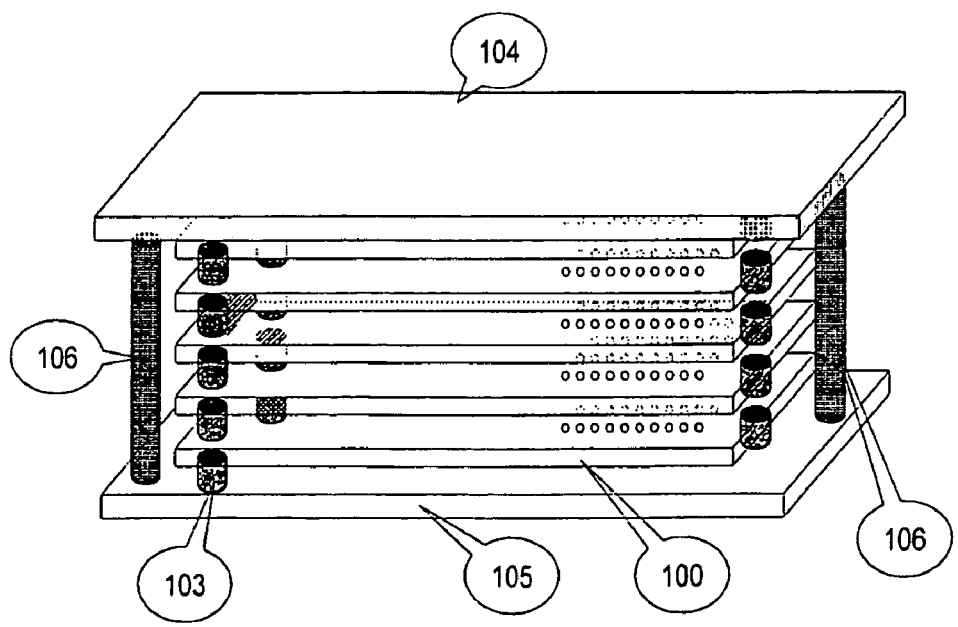

In order to produce laser light, a semi-transparent reflector 104 is provided on the top of the stacked chips, and a total reflector 105 is provided on the bottom of the stacked chips. As shown in FIGS. 8 and 9, piezoelectric crystals 106 are used to adjust the distance between the reflectors. The chips are sandwiched by the reflectors to form a laser resonant cavity. Piezoelectric crystals 103 are used to adjust the distance between the chips and the reflectors. Unlike the conventional VCSELs with Bragg reflector layers, each chip does not require an individual reflector according to the invention, thus providing the simple structure of the VCSEL and the ease of synchronization between the chips.

Figure 10:
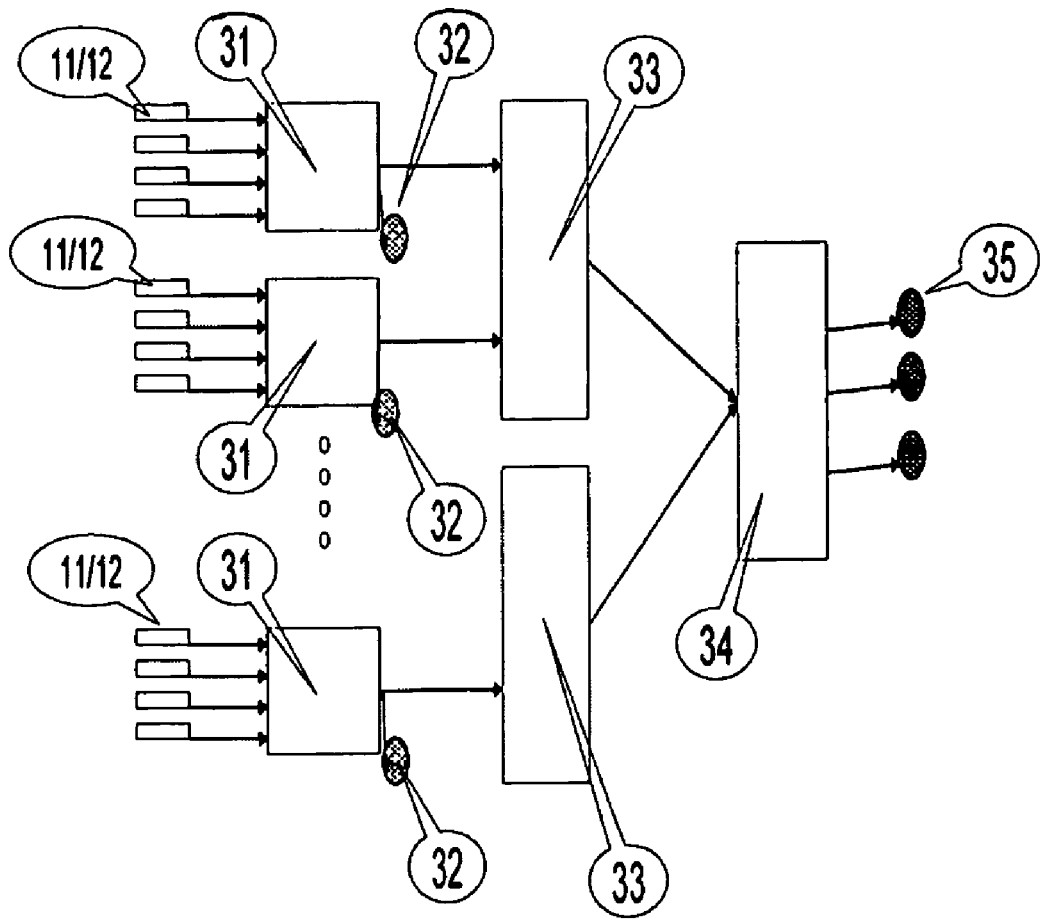
FIG. 10 shows a schematic diagram of a parameter feedback calculation module.

Referring to FIG. 10, the parameters inside the optical resonant cavity are collected by the measuring electrodes 11, 12, 13, and are calculated by a light emitting element parameter calculator 31 to give the optimum control voltage which is outputted by a light emitting element parameter control output module 32 to control the electrode 10 in FIG. 4. Feedback data enables the luminous structure to produce constant and stable resonance wavelengths. An optical resonant cavity parameter calculator 33 calculates the state for each optical resonant cavity and then transmits it to the chip distance calculator 34 to calculate a control voltage required for the distance between the chips. The control voltage is then outputted to a chip distance control output module 35 to control the piezoelectric crystals 103 for controlling the distance between the chips.

The specific structure of the parameter feedback calculator can be selected according to the use of the lasers, and may be formed as a simple analog signal phase-locking ring or a complicated software-guided real-time digital conversion system. They have respective drawbacks and advantages.

Each of the stacked chips is within the laser resonant cavity. A laser signal would be generated from one of the chips if a forward current exceeding a threshold is applied to the chip, and the laser signal can be received by all the other chips connected by the light channel. The parameter measuring electrodes can be utilized to detect the troughs of the standing wave to gain the minimum amplitude of the standing wave, at this point, light emission is in the optimum resonant state.

As mentioned above, each of the stacked chips is within the laser resonant cavity. In the case of the presence of reverse bias voltages, the impedance between the negative and positive electrodes is very high, and the current therebetween is very small if there is no light inside the cavity. However, if the light channel has at least one of the other chips which is luminous, the active layers at the wave crests would absorb photons and release positive and negative carriers which flow towards the electrodes and are magnified dramatically to generate a photo current in the case of negative bias voltages. Therefore, all the chips through which the light channel passes can receive the signals. The parameter measuring electrodes can be utilized to detect the crests of the standing wave to gain the maximum amplitude of the standing wave, and at this point, light receiving is in the most sensitive resonant state.

A simple light emitting mechanism is provided because the high series resistance induced by the Bragg reflectors is eliminated from the power supply line. The multiple active layers of the optical resonant cavities enable a remarkable increase to the Q-values of the optical resonant cavities. The controlled adjustment of the optical parameters and the distances between the chips allows the outputs of the plurality of chips to be added up without power loss. It is reported that conventional vertical cavity surface emitting lasers (VCSELs) have an efficiency of 50-60%, while the lasers of the invention may reach an electro-optical conversion efficiency of up to 70-90% after the above disadvantages are eliminated.

Figure 11:
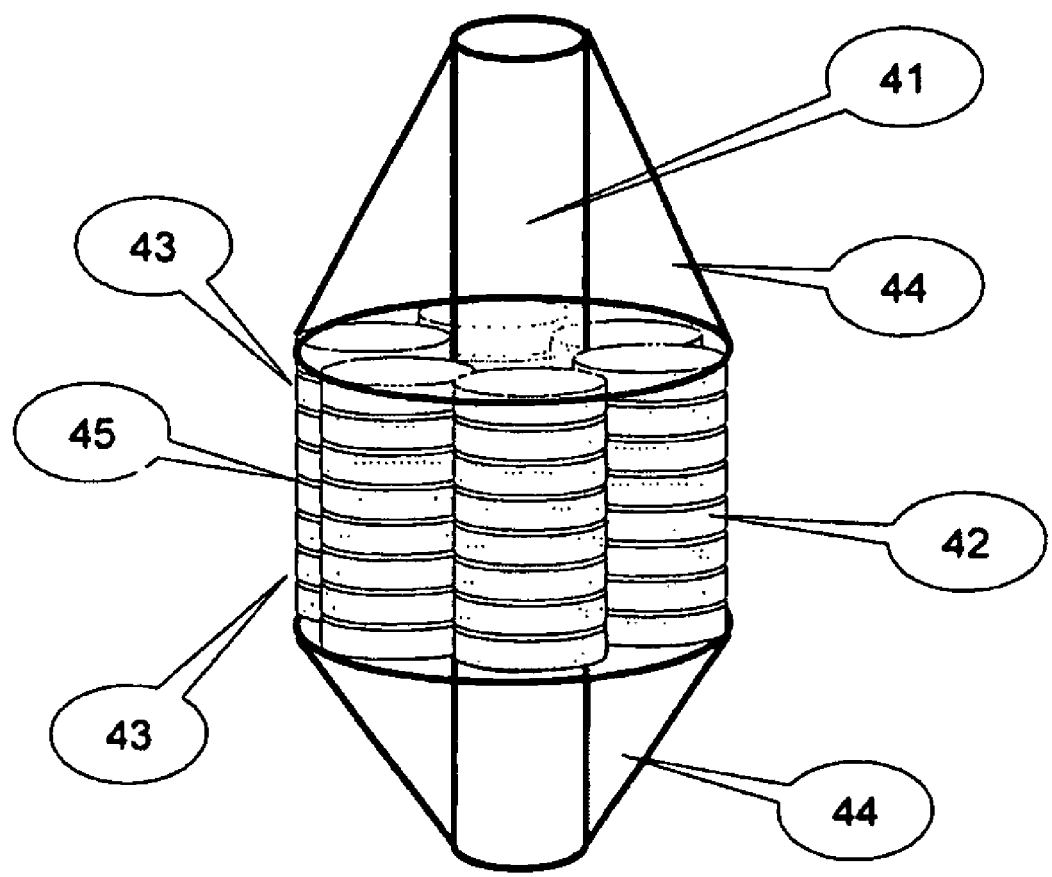
FIG. 11 shows a schematic diagram of the chips which are paralleled to aggregate on a same surface of a chip.

Except the series connection of the plurality of lasers (optical resonant cavities) 42, they can also be paralleled to aggregate on a same surface of a chip, as shown in FIG. 11. Respective partial reflectors 43 are arranged above and beneath the optical resonant cavities for adjusting the number of layers of the partial reflectors and the ratio of the reflector layers at two ends of the chip stack. This can control the coupling of the optical resonant cavities and a light channel 41 such that the light channel forms at a center of the aggregation of the lasers. Piezoelectric crystals can be disposed between the partial reflectors for adjusting the partial reflectors for their distances and parallel angles. Outside the partial reflectors can be disposed conical energy collectors 44 which have a respective total reflection surface with high reflectivity for collecting external light emitting from the optical resonant cavities into the light channel 41 or the light channel 120 in FIG. 1.

The invention claimed is:

1. A vertical cavity surface light emitting device (VCSLED), characterised in that the VCSLED comprises
at least three optical resonance units,
each optical resonance unit has a vertical thickness of half wavelength of the emitted light of the VCSLED, and comprises a highly-doped conduction region, an insulating layer, a negative electrode, confinement layers, an active layer, and a positive electrode,
wherein the at least three optical resonance units are stacked repetitively vertically to constitute an optical resonant cavity having multiple active layers.

2. The VCSLED with multiple active layers according to claim 1, wherein the optical resonant cavity has repeated n-p symmetrical structures or asymmetrical structures.

3. The VCSLED with multiple active layers according to claim 1, further comprising:
an optical path parameter control layer disposed between the active layers for fine tuning a resonance wavelength.

4. The VCSLED with multiple active layers according to claim 1, further comprising:
one or more parameter measuring electrodes arranged between the confinement layers to detect light field parameters inside the optical resonant cavity.

5. A laser produced from the VCSLED with multiple active layers according to claim 1, further comprising:
reflectors, wherein the VCSLED is sandwiched by the reflectors for emitting and receiving laser light.

6. The laser according to claim 5, further comprising:
piezoelectric crystals disposed between a plurality of chips for maintaining the active layers between the chips to be spaced apart at integer multiples of wavelength.

7. The laser according to claim 5, further comprising:
piezoelectric crystals disposed between the reflectors to adjust the reflectors for their distances and parallel angles.

8. The laser according to claim 7, further comprising:
one or more parameter measuring electrodes arranged between the confinement layers to detect light field parameters inside the optical resonant cavity; and
a parameter feedback calculation module connected to the parameter measuring electrodes and to the piezoelectric crystals.

9. A laser produced from the VCSLED with multiple active layers according to claim 1, wherein two or more of the VCSLEDs are paralleled to aggregate on a same surface of a chip, and the optical resonant cavities are provided with respective partial reflectors at their two ends to control the coupling of the optical resonant cavities with a light channel such that the light channel is formed at a center of the aggregation of the VCSLEDs.

10. The laser according to claim 9, further comprising:
a conical energy collector at each of the two ends of the optical resonant cavities of the aggregated VCSLEDs to collect external light emitting from the optical resonant cavities into the light channel through conical total reflection surfaces of the energy collectors.

11. The laser according to claim 9, further comprising:
piezoelectric crystals disposed between the reflectors to adjust the reflectors for their distances and parallel angles.

12. A signal bus produced from the laser according to claim 5, further comprising:
a signal line to connect stacked chips on which lasers with multiple active layers are arranged with their optical resonant cavities at a same position in alignment with each other, and constitutes a light channel that runs through and connects all the stacked chips.

13. A signal bus produced from the laser according to claim 9, further comprising:
a signal line to connect stacked chips on which lasers with multiple active layers are arranged with their optical resonant cavities at a same position in alignment with each other, and constitutes a light channel that runs through and connects all the stacked chips.

14. The laser according to claim 5, further comprising:
one or more parameter measuring electrodes arranged between the confinement layers to detect light field parameters inside the optical resonant cavity; and
a parameter feedback calculation module connected to the parameter measuring electrodes and to piezoelectric crystals.

15. A laser, comprising:
a vertical cavity surface light emitting device (VCSLED) with multiple active layers, including at least one optical resonance unit comprising a highly-doped conduction region, an insulating layer, a negative electrode, confinement layers, an active layer, and a positive electrode, wherein the optical resonance units are stacked repetitively in a vertical thickness of half wavelength to constitute an optical resonant cavity;
reflectors that sandwich the VCSLED by the reflectors to emit and receive laser light; and
piezoelectric crystals disposed between a plurality of chips to maintain active layers between the chips to be spaced apart at integer multiples of wavelength.

16. A laser, comprising:
a vertical cavity surface light emitting device (VCSLED) with multiple active layers, including at least one optical resonance cavity comprising a highly-doped conduction region, an insulating layer, a negative electrode, confinement layers, one or more parameter measuring electrodes arranged between the confinement layers to detect light field parameters inside the optical resonant cavity, an active layer, and a positive electrode, wherein the optical resonance units are stacked repetitively in a vertical thickness of half wavelength to constitute an optical resonant cavity;
reflectors that sandwich the VCSLED by the reflectors to emit and receive laser light; and
a parameter feedback calculation module connected to the parameter measuring electrodes and to piezoelectric crystals.

* * * * *